United States Patent
Aulnette et al.

(10) Patent No.: US 6,995,427 B2
(45) Date of Patent: Feb. 7, 2006

(54) SEMICONDUCTOR STRUCTURE FOR PROVIDING STRAINED CRYSTALLINE LAYER ON INSULATOR AND METHOD FOR FABRICATING SAME

(75) Inventors: Cécile Aulnette, Grenoble (FR); Frédéric Dupont, Grenoble (FR); Carlos Mazuré, Saint Nazaire les Eymes (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 0 days.

(21) Appl. No.: 10/763,978

(22) Filed: Jan. 22, 2004

(65) Prior Publication Data

US 2004/0150006 A1 Aug. 5, 2004

Related U.S. Application Data

(60) Provisional application No. 60/485,997, filed on Jul. 9, 2003, provisional application No. 60/485,998, filed on Jul. 9, 2003.

(30) Foreign Application Priority Data

Jan. 29, 2003 (EP) .................. 03290230
Jan. 29, 2003 (EP) .................. 03290231

(51) Int. Cl.
*H01L 29/76* (2006.01)

(52) U.S. Cl. ............ 257/345; 257/507; 257/615; 257/616

(58) Field of Classification Search ........ 257/345, 257/570, 615, 616

See application file for complete search history.

(56) References Cited

U.S. PATENT DOCUMENTS

| 5,770,868 A | 6/1998 | Gill et al. .............. 257/190 |
| 6,039,803 A | 3/2000 | Fitzgerald et al. ........ 117/89 |
| 6,059,895 A | 5/2000 | Chu et al. ............. 148/33.1 |
| 2002/0017642 A1 | 2/2002 | Mizushima et al. ........ 257/19 |
| 2002/0084000 A1 | 7/2002 | Fitzgerald ............. 148/33.2 |
| 2002/0125475 A1 * | 9/2002 | Chu et al. .............. 257/55 |

FOREIGN PATENT DOCUMENTS

| EP | 1 253 648 | 10/2002 |
| TW | 512487 | 12/2002 |
| WO | WO 02 15244 | 2/2002 |

OTHER PUBLICATIONS

B. Gallas et al., "Influence of misfit and threading dislocations on the surface morphology of SiGe graded-layers",; Journal of Crystal Growth 201/202, pp 547-550, (1999).
Douglas Paul, "The Physics, Material and Devices of Silicon Germanium Technology", Physics World, pp. 1-14.

(Continued)

*Primary Examiner*—Long Pham
(74) *Attorney, Agent, or Firm*—Winston & Strawn LLP (57) ABSTRACT

A semiconductor structure having a high-strained crystalline layer with a low crystal defect density and a method for fabricating such a semiconductor structure are disclosed. The structure includes a substrate having a first material comprising germanium or a Group (III)–Group (V)-semiconductor or alloy thereof. In addition, a crystalline epitaxial first layer, comprising a graded buffer layer and a substantially relaxed layer, is provided. The buffer layer is sufficiently relaxed to provide relaxation of the substantially relaxed layer deposited thereon. A further layer may be provided on the first layer, and the transfer of at least the further layer is facilitated by providing a weakened zone in the first layer.

31 Claims, 5 Drawing Sheets

OTHER PUBLICATIONS

Asano et al., "Structural characterization of $Si_{1-x}Ge_x$ alloy layers grown by molecular beam epitaxy on Si(001) substrates", American Institute of Physics, Journal of Applied Physics, vol. 87, No. 12, pp 8759-8765 (2000).

Cheng et al., "SiGe-on-Insulator (SGOI): Substrate Preparation and MOSFET Fabrication for Electron Mobility Evaluation," IEEE International SOI Conference, Oct. 2001, pp. 13-14 (2001).

Colinge, "Silicon-on-Insulator Technology," VLSI, p. 47.

Huang et al., "Electron and Hole Mobility Enhancement in Strained SOI by Wafer Bonding," *IEEE Transactions on Electron Devices*, vol. 49, No. 9, pp. 1566-1571 (Sep. 2002).

Iyer & Auberton-Herve (ed.), "Silicon Wafer Bonding Technology," EMIS Processing Series No. 1, pp. 22, 36, 57.

Li et al., "Investigation of strain relaxation of $Ge_{1-x}Si_x$ epilayers on Ge(001) by high-resolution x-ray reciprocal space mapping," *Semiconductor Science and Technology*, vol. 10, pp. 1621-1628 (Dec. 1995).

Takagi et al, "Device structure and electrical characteristics of strained-Si-on-insulator (strained-SOI) MOSFETs," *Material Science and Engineering*, vol. 89, No. 1-3, pp. 426-434 (Feb. 2002).

Taraschi et al., "Relaxed SiGe-on-insulator fabricated via wafer bonding and etch back," *J. Vac. Sci. Technol.*, B 20(2), pp. 725-727 (Mar./Apr. 2002).

* cited by examiner

SEMICONDUCTOR STRUCTURE FOR PROVIDING STRAINED CRYSTALLINE LAYER ON INSULATOR AND METHOD FOR FABRICATING SAME

This application claims the benefit of U.S. provisional application 60/485,997 filed Jul. 9, 2003 and 60/485,998 filed Jul. 9, 2003, the entire content of each of which is expressly incorporated herein by reference thereto.

BACKGROUND

The present invention relates to a semiconductor structure having a strained crystalline layer formed on a single crystal substrate or on an insulator and further to a method for fabricating such a semiconductor structure.

Strained, thin semiconductor layers, such as silicon layers, have enhanced electron and hole mobility characteristics which are advantageous for improving speed or decreasing power requirements of electronic devices. Because their use can lead to high performance devices having high speed and low power consumption, such layers are of interest in nearly all parts of microelectronics.

Strain in silicon layers can be induced, for instance, by growing a thin silicon layer on a relaxed SiGe layer with a high concentration of germanium. Because silicon is the smaller atom, the stress between silicon and such a SiGe layer increases gradually with increasing Ge concentration, and more favorable strain values can be achieved when the germanium concentration of the SiGe layer is as large as possible.

U.S. Published Application No. 2002/0084000 A1 discloses a method and a semiconductor structure for growing a GeSi layer with a gradually increasing germanium content on a silicon substrate up to a germanium content of about 50%. Increasing germanium content of the graded GeSi layer causes cracks and a high number of threading dislocations to occur in the layer. In order to remove a cross-hatch pattern on the surface of the GeSi layer, a surface planarization step such as a Chemical Mechanical Polishing is applied to the GeSi surface. The planarization step prevents the continued roughening of the surface and leads to dislocation blocking as grading continues, and the germanium content of the GeSi is further increased until a pure Ge layer results on the top of the structure.

International Publication No. WO 02/15244 A2 describes a method and a semiconductor structure that provides a SiGe buffer layer that serves as a seed layer for a strained silicon film. A SiGe layer is deposited on a single crystal silicon wafer, wherein the germanium concentration is gradually increased up to 25% germanium. Then, a relaxed SiGe cap layer is deposited, having a final Ge composition of 25%. The process of growing a relaxed SiGe layer is very complex. The growth generates a very high density of misfit dislocations and a cross-hatch pattern of the SiGe layer. Furthermore, the above method is limited to a germanium content below 40% when a crystal defect density below 104 $cm^{-2}$ is targeted.

Strained semiconductor layers can also be effectively used if they are transferred on an insulator layer, resulting in a SOI (silicon-on-insulator)-type structure, whose benefits are commonly known in microelectronics and micromechanics.

A publication by Cheng et al. at the 2001 IEEE International SOI Conference called "SiGe-on-Insulator (SGOI): Substrate Preparation and MOSFET Fabrication for Electron Mobility Evaluation" describes a method for fabricating a SiGe-on-insulator structure. A graded SiGe layer was grown on a single crystalline silicon donor wafer. During SiGe growth, the germanium content was gradually increased until a germanium concentration of about 25% was reached. A relaxed SiGe layer was then grown on the graded SiGe layer, and hydrogen ions were implanted into the relaxed SiGe layer, forming a weakened zone in the relaxed SiGe layer. The implanted structure was then bonded with an oxidized silicon wafer. After annealing, the bonded structure was split into two parts along the weakened zone resulting in the SiGe-on-insulator structure and a residual structure. A strained silicon layer was then grown on the SiGe layer resulting in a Si-on-SiGe-on-insulator structure.

This resulting structure, however, has a critical disadvantage in that the strain of the strained silicon layer on top of the SiGe layer cannot be increased to a value of commercial importance. This is due to the limited germanium content of the SiGe layer which cannot be increased over 25% without risking formation of a high dislocation density in the SiGe layer, which considerably influences the electronic characteristics of the strained silicon layer.

The present invention addresses these problems of the prior art, by providing a commercially useful high-strained silicon layer with a low defect density on a single crystal substrate as well as on an insulator.

SUMMARY OF THE INVENTION

The present invention provides a semiconductor structure having a high-strained crystalline layer with a low crystal defect density and a simple and relatively easy method for fabricating such a semiconductor structure.

In an implementation according to the invention, a semiconductor structure has a substrate that includes a first material comprising germanium or a Group (III)–Group(V)-semiconductor or an alloy thereof. The structure also includes a crystalline epitaxial graded buffer layer on the first material, and a crystalline epitaxial substantially relaxed layer on the buffer layer. The buffer layer is sufficiently relaxed to provide relaxation of the substantially relaxed layer deposited thereon.

An advantageous embodiment includes a graded buffer layer having a concentration of germanium that decreases between the substrate and the relaxed layer. In addition, when the first material is germanium, the concentration of germanium in the graded layer decreases from 100 percent germanium to about 40 to 80 percent germanium. The relaxed layer may also have a substantially constant silicon concentration of about 20 to 60 percent. The graded buffer layer, the relaxed layer, or both may include carbon.

The semiconductor substrate may comprise at least one of a single crystal germanium wafer, a single Group (III)–Group (V)-semiconductor wafer, a substrate having an epitaxial germanium layer, or a substrate having an epitaxial Group (III)–Group (V)-semiconductor layer.

In another favorable implementation, the structure also includes at least one crystalline epitaxial strained layer on the relaxed layer that is composed of a second material which is different from the first material. The strained layer may be a silicon layer, may be less than 50 nanometers thick, and may include carbon.

The semiconductor structure of the present invention may also be used for fabricating a strained crystalline layer on an insulator structure when further provided with an insulator layer and a base substrate. Such semiconductor structure includes a semiconductor substrate of a first material comprising germanium or a Group (III)–Group (V)-semiconductor, a crystalline epitaxial buffer layer comprising the first material, the buffer layer on the substrate, a substantially relaxed layer on the buffer layer, an insulator layer, and a base substrate.

Favorable implementations of this variation may include a strained crystalline epitaxial layer on the insulator layer, or on the substantially relaxed layer, or between the insulator layer and the substantially relaxed layer. In addition, a weakened zone may be formed in the substantially relaxed layer, and at least one of the graded buffer layer, relaxed layer, and strained layer may include carbon.

Also provided is a method for fabricating a semiconductor structure. The technique includes growing a crystalline epitaxial buffer layer on a substrate that includes a first material comprising at least one of germanium or a Group (III)–Group (V)-semiconductor or an alloy thereof, wherein the buffer layer contacts the first material, and growing a crystalline epitaxial substantially relaxed layer on the buffer layer. The buffer layer is sufficiently relaxed to provide relaxation of the substantially relaxed layer.

In an advantageous embodiment, the first material is germanium and its concentration through the buffer layer decreases from 100 percent to about 40 to 80 percent. The relaxed layer may have a substantially constant silicon content of about 20 to 60 percent. The method also includes growing on the relaxed layer at least one crystalline epitaxial strained layer of a second material which is different from the first material. The strained layer may be a silicon layer.

The present invention also provides a simple and relatively easy method for fabricating a semiconductor structure with a high crystal quality and a high strained crystal semiconductor layer on top of an insulator. Such a method includes growing a crystalline epitaxial first layer, comprising a graded buffer layer and a substantially relaxed layer, on a substrate that includes a first material of at least one of germanium or a Group (III)–Group (V)-semiconductor, wherein the buffer layer contacts the first material; providing a further layer on the relaxed layer; and providing a weakened zone, for example by implanting atomic species, in the first layer to facilitate transfer of at least the further layer.

In an advantageous embodiment of the invention, the weakened zone may be provided in the substantially relaxed layer, and the further layer can be an insulator layer, so that the insulator layer and part of the relaxed layer can be transferred. The insulator layer could be bonded to a base wafer, and the intermediate structure could be detached along the weakened zone in the relaxed layer to form a semiconductor structure that includes a portion of the relaxed layer, the insulator layer, and the base wafer.

Another favorable embodiment includes a strained crystalline epitaxial layer grown on the portion of the relaxed layer of the transfer structure, which could then be heat-treated.

The further layer could also be an epitaxially grown strained layer, and an insulator layer could be provided on the strained layer. The insulator layer may also be bonded to a base wafer, and this intermediate structure could be detached along the weakened zone in the relaxed layer, or in the boundary plane between the relaxed layer and the strained layer, to form a semiconductor structure that includes the strained layer, the insulator layer, and the base wafer. After detachment, any residual portion of the relaxed layer on the strained layer may be selectively removed.

In a further advantageous implementation, the strained layer may be less than 50 nanometers thick, and the buffer layer and/or the relaxed layer may be doped with carbon at a level below one percent carbon.

An improved method for providing a substantially relaxed layer on a semiconductor includes growing an epitaxial graded buffer layer of germanium-silicon on the substrate starting from 100 percent germanium to 60 percent germanium and 40 percent silicon. In this technique, the buffer layer is sufficiently relaxed to provide relaxation of the substantially relaxed layer thereon and is present in a thickness that is less than that of a silicon-germanium buffer layer. At least one crystalline epitaxial strained layer could be grown on the relaxed layer, and the semiconductor structure may comprise at least one of a single crystal germanium wafer, a Group (III)–Group (V)-semiconductor wafer, a substrate having an epitaxial germanium layer, or a substrate having an epitaxial Group (III)–Group (V)-semiconductor layer.

BRIEF DESCRIPTION OF THE DRAWINGS

Other aspects and advantages of the present invention will become clear from reading the following detailed description of the preferred embodiments of the invention, given by way of example and with reference to the appended drawings, in which.

DETAILED DESCRIPTION OF THE PREFERRED EMBODIMENTS

Figure 1:
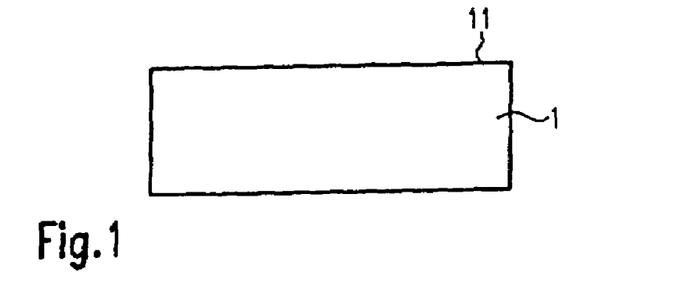
FIG. 1 is a simplified diagram of a semiconductor substrate which may be used in a first step of a method according to a first embodiment of the invention.

FIG. 1 illustrates a semiconductor substrate 1 used in a first step of the present method. The semiconductor substrate 1 is a single crystal germanium wafer which has a commonly available size and known electronic characteristics. The germanium wafer or donor wafer 1 has a polished and cleaned upper surface 11. In another embodiment, the semiconductor donor substrate can be a Group (III)–Group (V)-semiconductor wafer, such as a GaAs wafer, or a substrate having a surface epitaxial Ge layer, an epitaxial Group (III)–Group (V)-semiconductor layer such as a GaAs, GaInP or InP layer, or an alloy of these materials. For instance, the substrate can include a GaAs wafer or a GaAs layer which is covered by a Ge layer.

Figure 2:
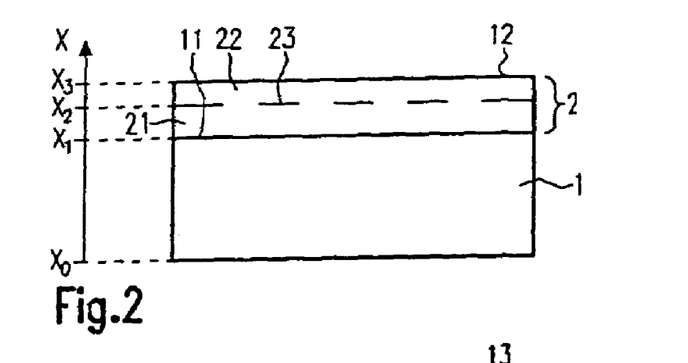
FIG. 2 illustrates the first step of the first embodiment according to the invention.

FIG. 2 illustrates the first step of the first embodiment wherein a first crystalline epitaxial layer 2 is grown on the semiconductor donor substrate 1 shown in FIG. 1. The first crystalline epitaxial layer 2 consists of a composition of germanium and silicon forming a GeSi layer. The GeSi layer 2 is deposited directly onto the upper surface 11 of the germanium wafer 1. In yet another embodiment, a seed layer of Ge can be deposited onto the upper surface 11 prior to growing the GeSi layer 2.

The GeSi layer 2 consists of two layers, a graded buffer GeSi layer 21 ($x_1$ to $x_2$) and a relaxed GeSi layer 22 ($x_2$ to $X_3$). The graded buffer GeSi layer 21 has a silicon concentration of about 0% near the surface 11 of the germanium wafer 1. The silicon content of the buffer GeSi layer 21 increases gradually beginning from the surface 11 of the germanium wafer 1 up to a level 23 where the silicon content of the GeSi layer is about 20% to 60%. Consequently, the germanium content of the buffer GeSi layer 21 decreases from about 100% at the surface 11 to a concentration of about 40% to 80% germanium at the level 23. A relaxed GeSi layer is formed on top of the level 23 and has a silicon to germanium ratio which corresponds to about the maximum silicon to germanium ratio of the buffer layer 21. The relaxed GeSi layer 22 has a very low defect density of about $10^4$ cm$^{-2}$. The GeSi layer 2 may be doped with carbon having a concentration percentage below 1%.

Figure 3:
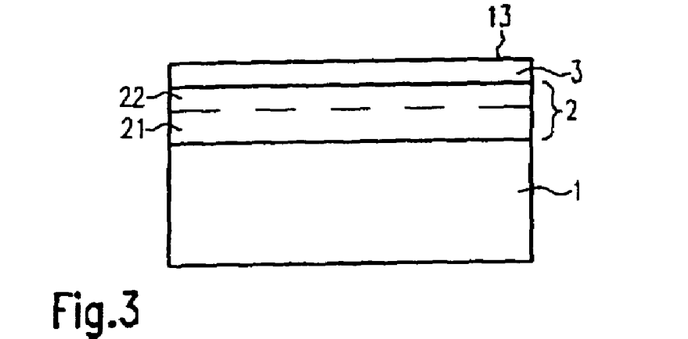
FIG. 3 illustrates a second step of the first embodiment according to the invention resulting in a semiconductor structure with an insulator layer on top of the relaxed layer.

FIG. 3 illustrates a second step of the first embodiment. In the second step, an insulator layer 3 is deposited on the first layer 2. The first layer 2 is thus an intermediate layer between the substrate 1 and the insulator layer 3. The insulator layer 3 consists of silicon dioxide and/or silicon nitride, and is deposited at a temperature below 900° C. in the embodiment shown. In another example, the insulator layer 3 can be a thermal oxide. The thickness of the insulator layer is adjusted to accommodate the target layer thickness of a SiGe/strained silicon layer that is to be transferred onto a base wafer. The insulator layer 3 has an upper surface 13. The semiconductor structure shown in FIG. 3 is an intermediate product for fabricating a strained crystalline layer on an insulator according to the present invention.

Figure 4:
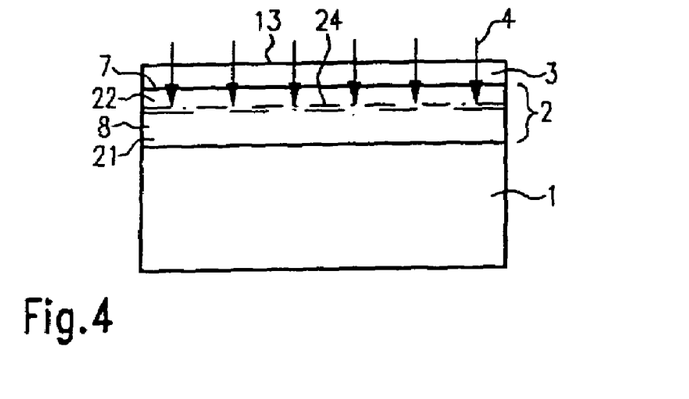
FIG. 4 illustrates an implantation step applied to the structure shown in FIG. 3.

FIG. 4 shows an implantation step which may be applied to the structure shown in FIG. 3. The structure of FIG. 3 is implanted with hydrogen species 4 using an implantation dose of greater than $5 \times 10^{16}$ cm$^{-2}$ at an appropriate energy level below about 180 keV. The hydrogen species 4 pass through the upper surface 13 and through the insulator layer 3 into the first layer 2, to a level 24 in the first layer 2. The level 24 may correspond to the level 23 in the first layer 2, which is between the buffer GeSi layer 21 and the relaxed GeSi layer 22, or may be at another level in the relaxed layer 22. Due to the implantation, the level 24 is a weakened zone and forms a predetermined detachment zone.

In another step which is not shown in the figures, the surface 13 of the insulator layer 3 is cleaned with standard silicon IC manufacturing post-implantation treatments. If required, the insulator layer 3 may be removed and a fresh insulator layer can be deposited.

Figure 5:
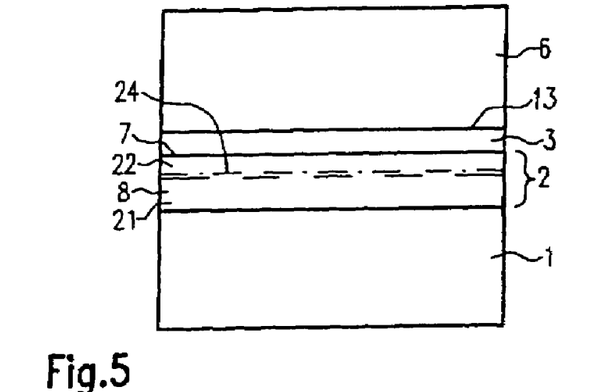
FIG. 5 illustrates a bonding step of the structure of FIG. 4.

FIG. 5 shows a bonding step which is applied to the structure shown in FIG. 4. In the bonding step, a base wafer 6 consisting of silicon, germanium, a Group (III)–Group (V)-semiconductor, quartz, glass, or the like, has a surface treatment and then is bonded with the surface-treated insulator layer 3 of the structure of FIG. 4. Surface treatment before bonding can be accomplished by using chemical-mechanical polishing, surface scrubbing, oxygen-plasma treatment and other available surface treatment techniques. The base wafer 6 can be directly bonded to the surface 13 of the insulator layer 3. According to another embodiment of the invention, the base wafer 3 can have a dielectric layer on its bonding surface which will be bonded with the surface 13 of the insulator layer 3.

Figure 6:
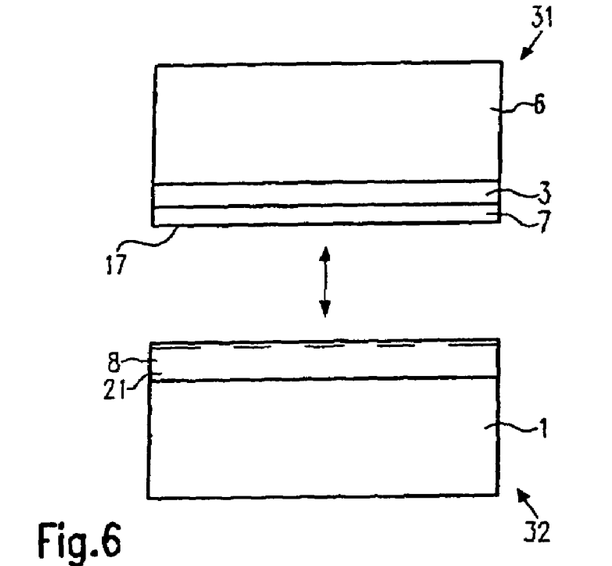
FIG. 6 illustrates a splitting step of the structure of FIG. 5 according to a third step of the first embodiment of the invention.

FIG. 6 shows a third step of the method according to the first embodiment. The third step is a detachment step in which the structure shown in FIG. 5 is separated into two semiconductor structure parts 31 and 32. The parts 31 and 32 are detached along the predetermined weakened zone 24 which was formed during the implantation step shown in FIG. 4. The resulting part 31 consists of the base wafer 6 on which the insulator layer 3 is formed, and on top is a portion or a part 7 of the GeSi layer 2. The part 7 preferably consists of relaxed GeSi material. The other part 32 includes a donor germanium wafer 1 and the residual part 8 of the GeSi layer 2. The residual part 8 preferably includes the graded buffer GeSi layer 21 and a residual portion of the former relaxed GeSi layer 22.

The transfer technique shown in FIG. 6 may be the SMART-CUT® process, and a description of the process can be found in a book entitled: "Silicon-On-Insulator Technology: Materials to VSLI, 2nd Edition" by Jean-Pierre Colinge, published by "Kluwer Academic Publishers", at pages 50 and 51. This transfer process can be used to create multilayer wafers like those mentioned above. It can also be used to create wafers with an extremely thin surface layer having a thickness on the order of a few microns or less. A thermal or a shock treatment could be applied to the structure shown in FIG. 5 to cause detachment.

In a further step which is not shown, the part 7 of the GeSi layer 2 may be treated by chemical mechanical polishing and, optionally, by a thermal treatment.

Figure 7:
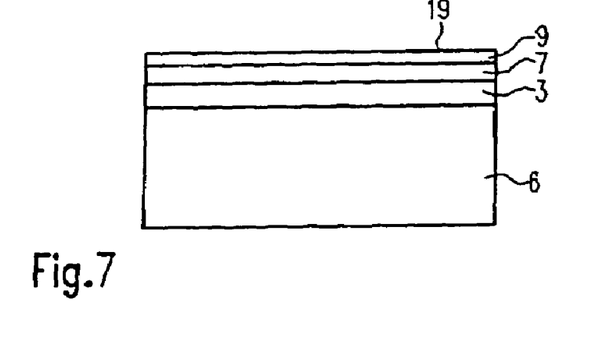
FIG. 7 illustrates an inventive semiconductor structure which has been fabricated by the method according to the first embodiment of the invention shown in FIGS. 1 to 6.

FIG. 7 shows a fourth step of the method according to the first embodiment of the present invention. A second crystalline epitaxial layer 9 is grown on the surface 17 of the separated part 31. The second layer 9 is a strained silicon layer with a thickness less than 50 nanometers and a carbon content below 1%. This strained silicon layer has a very high strain and a low defect density. The semiconductor structure shown in FIG. 7 is a novel structure which corresponds to an end product of the method according to the first embodiment of the present invention. The structure consists of the base wafer 6, the insulator layer 3, the part 7 of the GeSi layer 2 and the second layer 9. The insulator layer 3 is an intermediate layer between the base wafer 6 and the part 7, and the part 7 is an intermediate layer between the insulator layer 3 and the second layer 9. Another advantageous embodiment of the invention includes an additional layer, such as a seed layer, between each of the layers of the structure shown in FIG. 7.

The strain of the silicon layer 9 is what results when a crystalline silicon layer having a thickness below 50 nm is grown epitaxially on a GeSi layer with a germanium content of about 40 to 80% germanium. The strain is higher than that of a conventional silicon layer having a thickness below 50 nm grown on a GeSi layer with a germanium content below 40%. The structure shown in FIG. 7 can be thermally annealed after the strained silicon layer 9 is grown.

FIGS. 8 to 14 illustrate steps of a method according to a second embodiment of the present technique. The same reference numerals used in FIGS. 8 to 13 are used in FIGS. 1 to 7 to indicate the same parts and components.

Figure 8:
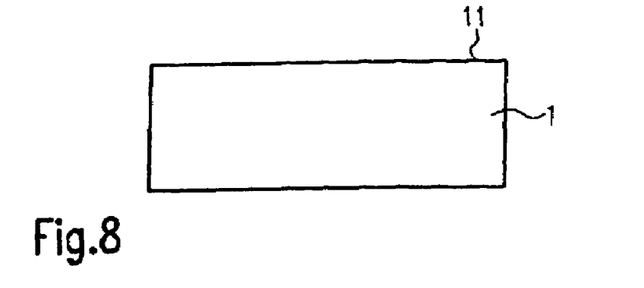
FIG. 8 illustrates a semiconductor substrate which is used in a first step of a second embodiment according to the invention.

FIG. 8 shows a semiconductor substrate 1 which is used in a first step of the second embodiment of the present invention. The semiconductor substrate 1 is a single crystal germanium wafer and has an upper surface 11.

Figure 9:
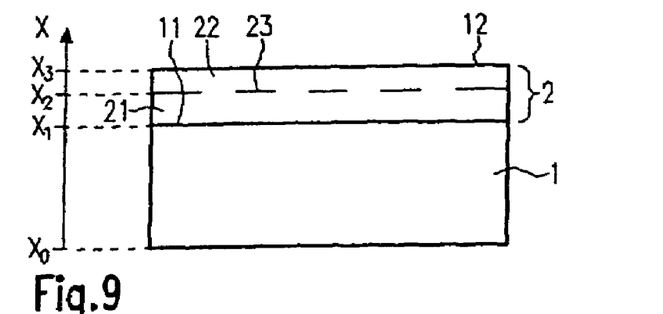
FIG. 9 illustrates the first step of the second embodiment according to the invention.

FIG. 9 shows the first step of the second embodiment of the present invention. In the first step, a first crystalline epitaxial layer is grown on the upper surface 11 of a germanium wafer 1. As mentioned with reference to FIGS. 1 to 7, in another embodiment a Group (III)–Group (V)-semiconductor or a substrate having an epitaxial surface layer of Ge or Group (III)–Group (V)-semiconductor layer can be used instead of the Ge wafer. The first crystalline epitaxial layer 2 is a GeSi layer consisting of a graded buffer GeSi layer 21 and a relaxed GeSi layer 22. The graded buffer GeSi layer 21 is grown on the upper surface 11 of the germanium wafer 1 with a gradually increasing silicon content. The silicon content increases beginning from the surface 11 at a percentage of about 0% to a level 23 in the first layer 2 where the concentration is about 20% to 60% silicon. Above the level 23, the relaxed GeSi 22 is grown with a nearly constant silicon to germanium ratio which corresponds approximately to the maximum silicon to germanium ratio of the graded buffer GeSi layer 21. Consequently, the germanium content of the graded buffer layer 21 decreases from the surface 11 where the germanium content is about 100% down to the level 23 where the germanium content is about 40% to 80% germanium. The GeSi layer 2 can be doped with carbon at a percentage below 1% carbon. The first layer 2 has an upper surface 12.

Figure 10:
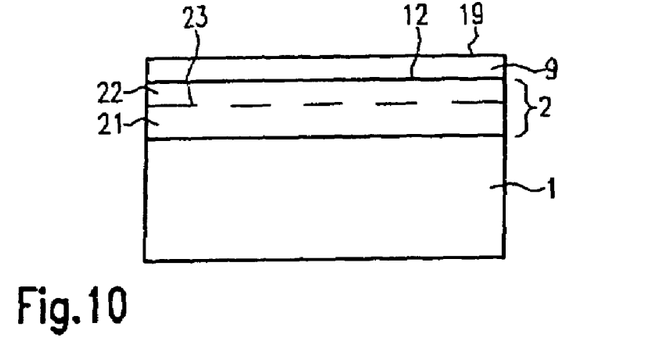
FIG. 10 illustrates a second step of the second embodiment according to the invention.

FIG. 10 shows a second step of the method according to the second embodiment of the present invention. A second crystalline epitaxial layer 9 with a carbon content below 1% is grown on the first layer 2. The second crystalline epitaxial layer 9 is a strained silicon layer with a thickness less than 50 nm, and has a very low crystal defect density and a high strain. The second layer has an upper surface 19.

Because the germanium and/or Group (III)–Group (V)-semiconductor substrate provides a very good basis for stress relaxation in at least a part of the first layer, resulting in a low crystal defect density in at least this part of the first layer, the first layer can accommodate the stress between the substrate material and the material of the second layer which results in a high quality second layer. The present method utilizes the different material characteristics of the first and second layers to create a high strain in the second layer, and therefore provides a shortened technique for achieving a relaxed part of the first layer so that a high germanium and/or Group (III)–Group (V)-semiconductor concentration can be reached in the first layer leading to a high strain in the second layer.

Figure 11:
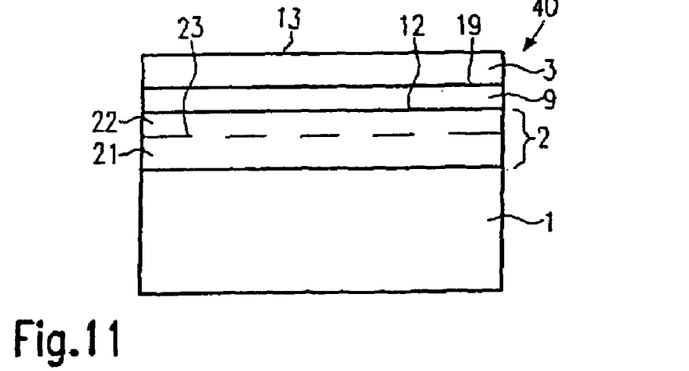
FIG. 11 illustrates a third step of the second embodiment according to the invention which results in a semiconductor structure with the strained layer between the insulator layer and the relaxed layer.

FIG. 11 shows a third step of the method according to the second embodiment of the present invention. In the third step, an insulator layer 3 is deposited on the surface 19 of the strained silicon layer 9. The insulator layer 3 consists of silicon dioxide and/or silicon nitride. The thickness of the insulator layer 3 depends on the target layer of the SiGe/strained silicon layer which will be transferred on a base wafer. The insulator layer 3 has an upper surface 13.

Figure 12:
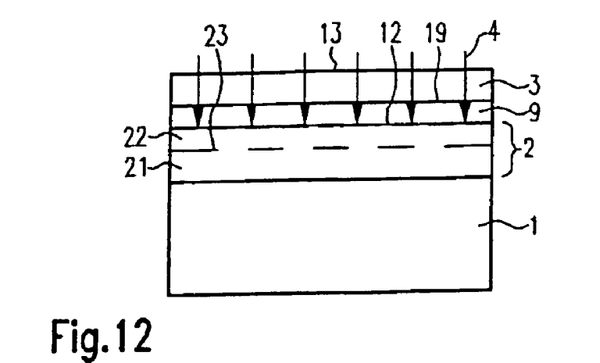
FIG. 12 illustrates an implantation step applied to the structure shown in FIG. 11.

FIG. 12 shows an implantation step applied to the structure 40 shown in FIG. 11. Hydrogen species 4 are implanted through the upper surface 13 and through the insulator layer 3 until approximately the level of the former surface 12 that forms the interface between the GeSi layer 2 and the strained silicon layer 9. Due to the implantation, the interface 12 is pre-weakened resulting in a predetermined detachment zone at this interface 12. The implantation is performed with a hydrogen dose of greater than $5 \times 10^{14}$ cm$^{-2}$ at an appropriate energy which is below about 180 keV. After implantation, the surface 13 is cleaned with standard silicon IC manufacturing post-implantation treatments. If required, the insulator layer 3 may be removed and a new fresh insulator layer can be deposited, and these post implantation steps are not shown. A surface treatment of the structure shown in FIG. 12 follows. The surface treatment can include chemical-mechanical polishing, surface scrubbing, oxygen-plasma treatment or a similar process.

Figure 13:
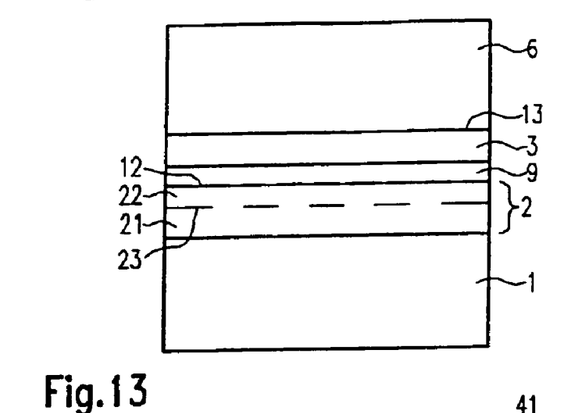
FIG. 13 illustrates a bonding step applied to the structure shown in FIG. 12.

FIG. 13 shows a bonding step in which the structure shown in FIG. 12 is bonded with the base wafer 6. The base wafer 6 bonds on the surface 13 of the insulator layer 3. The base wafer may consist of silicon, germanium, a Group (III)–Group (V)-semiconductor, quartz, glass, etc. According to another embodiment of the present invention, the base wafer 6 can include an insulator layer at its bonding surface which is bonded with the surface 13 of the insulator layer 3.

Figure 14:
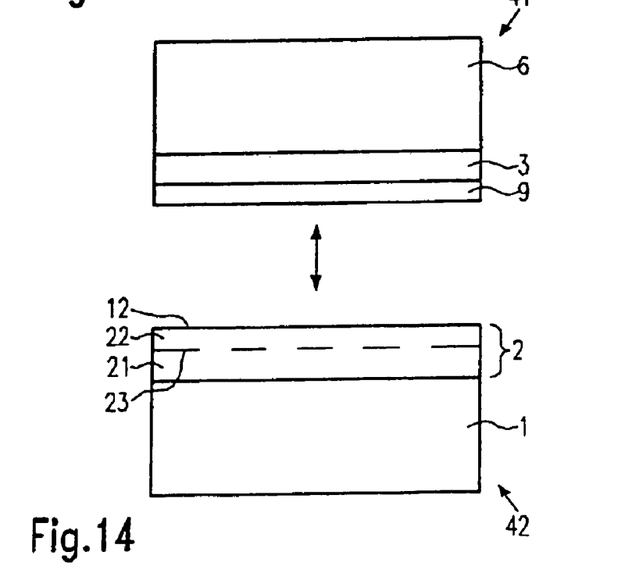
FIG. 14 illustrates a fourth step of the second embodiment according to the invention which is applied to the structure shown in FIG. 13.

FIG. 14 shows a fourth step of the method according to the second embodiment of the present invention. The structure shown in FIG. 13 is split into two parts 41 and 42. The splitting step may be performed similarly to the detachment step illustrated by the SMART-CUT® process in which a structure is split into two parts along a predetermined weakened zone, for example, by using a thermal or a shock treatment. In FIG. 14, the weakened zone between parts 41 and 42 corresponds to the predetermined zone at the interface 12 between the first layer 2 and the second strained silicon layer 9. The first split part 41 consists of the base wafer 6 on which the insulator layer 3 is formed and includes the strained silicon layer 9. Thus, the insulator layer 3 is an intermediate layer between the base wafer 6 and the strained layer 9. In another embodiment, an additional layer can be located between the base wafer 6 and the insulator layer 3 and/or between the insulator layer 3 and the strained layer 9. The split part 42 includes the donor germanium wafer 1 and the GeSi layer 2.

Figure 15:
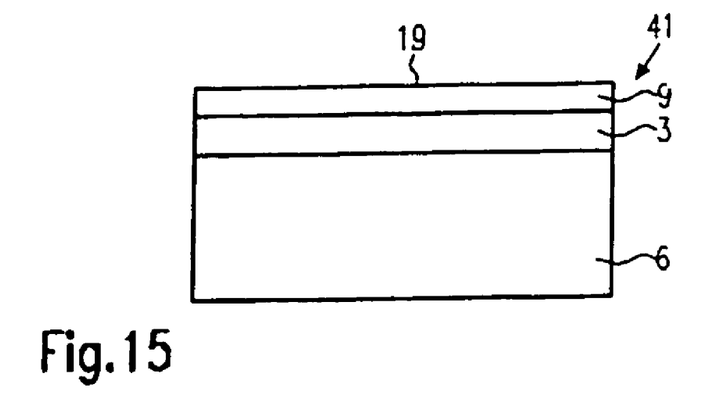
FIG. 15 illustrates a structure according to the invention which has been fabricated by the method according to the second embodiment of the present invention shown in FIGS. 8 to 14.

FIG. 15 shows the end-product of the method according to the second embodiment, which corresponds to the split part 41 shown in FIG. 14. The structure 41 can be thermally annealed and any residual GeSi portion that may be on the strained silicon layer 9 can be removed. The strained silicon layer 9 of the structure 41 has a very high strain combined with a very low defect density below $10^4$ cm$^{-2}$. The strain of the silicon layer 9 is the strain that results when a crystalline silicon layer of a thickness below 50 nm is grown epitaxially on a GeSi layer with a high germanium content of about 40 to 80% germanium. This strain is higher than the strain of a conventional silicon layer with a thickness below 50 nm grown on a GeSi layer with a germanium content below 40%.

Figure 16:
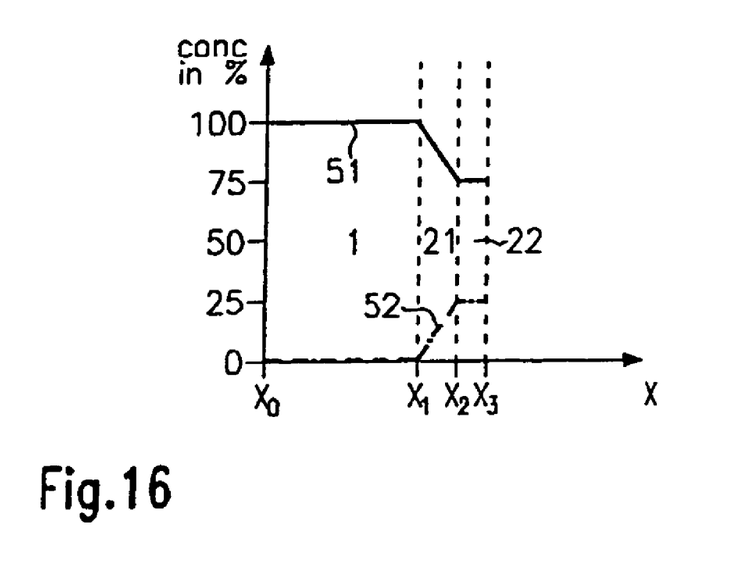
FIG. 16 illustrates the concentration distribution versus thickness of the semiconductor structure shown in FIGS. 2 and 9.

FIG. 16 shows the concentration distribution versus thickness (x) of the semiconductor structure shown in FIGS. 2 and 9. The reference numerals in FIG. 16 are identical to those used with reference to FIGS. 2 and 9 and indicate the same components. In FIG. 16, the continuous line 51 represents the germanium content of the semiconductor structure shown in FIGS. 2 and 9, which is about 100% in the germanium substrate 1. The dashed line 52 represents the silicon content of the semiconductor structure of FIGS. 2 and 9 which is about 0% in the germanium substrate 1. The silicon content 52 increases in the graded buffer GeSi layer 21 from 0% to about 30%, whereas the germanium content 51 in the buffer layer 21 decreases to a value of about 70%. In FIG. 16, the increase of silicon 52 and the decrease of germanium 51 is shown as being continuous. However, instead of a continuous change, a gradual or a step-by-step change of the concentration of silicon and/or germanium can be used in the buffer layer 21. Furthermore, there can be one or more regions in the buffer layer 21 in which there is no change of the germanium and/or the silicon content.

The relaxed GeSi layer 22, which is on top of the buffer layer 21, has a nearly constant proportion between germanium and silicon of about 20 to 60% silicon to about 40 to 80% germanium, shown in FIG. 16 with 30% silicon and 70% germanium. The relaxed layer 22 is nearly dislocation-free. The crystal defect density of the relaxed layer 22 is below 104 cm$^{-2}$. The low crystal defect density of that portion influences the growth of the second layer such that it grows with a very high quality, resulting in a second layer with very good electronic characteristics.

Although the preferred embodiments described above use the SMART-CUT® technology for layer transfer, any other layer transfer technique such as a Bond-and-Etchback technology or other techniques that introduce weakened zones, for example by using a porous layer formation, can be applied.

The invention thus provides a method for fabricating a strained crystalline layer on an insulator that includes providing a semiconductor donor substrate comprising germanium and/or a Group (III)–Group (V)-semiconductor; providing at least one first crystalline epitaxial layer in a first step, wherein the content of germanium and/or the Group (III)–Group (V)-semiconductor of a buffer layer of the first layer is proportionately decreased during the first step; providing at least one insulator layer in a second step, wherein the first layer is provided between the substrate and the insulator layer; detaching the first layer in a third step; and providing at least one second crystalline epitaxial layer on the split first layer, in a fourth step.

The invention therefore teaches that it is possible to fabricate a semiconductor structure in which the germanium and/or Group (III)–Group (V)-semiconductor content decreases in the direction from the substrate to a second layer. A high content of germanium and/or the Group (III)–Group (V)-semiconductor can thus be achieved in the first layer resulting in a high strain of the second layer. The decrease of germanium and/or the Group (III)–Group (V)-semiconductor allows the growth of at least a part of the first layer with a low defect density, which results in high crystal quality of the second layer. The highly strained, high quality second layer can easily be transferred to an insulator layer resulting in a semiconductor structure which combines the benefits of a SOI-structure with good electronic characteristics of a strained crystalline layer.

According to a further embodiment, the first layer is provided on a single crystal germanium wafer, a single crystal Group (III)–Group (V)-semiconductor wafer, an epitaxial germanium layer or an epitaxial Group (III)–Group (V)-semiconductor layer. These substrates provide a high amount of germanium and/or the Group (III)–Group (V)-semiconductor material such as GaAs, allowing the growth of the first layer with a high germanium content and a high crystal quality on these substrates. The germanium wafer and/or the Group (III)–Group (V)-semiconductor wafer is a stable substrate which permits handling of a strained crystalline layer on the insulator during the fabrication process.

In a favorable embodiment of the invention, the silicon content of the buffer layer is increased in the first step to 20% to 60% silicon, preferably to about 20% to 50% or 20% to 40%. The proportionate increase of silicon permits relaxation of the buffer layer, especially of a GeSi layer, in the first step, and allows for a good lattice mismatch accommodation between the substrate and the silicon layer on top of the first layer. Relaxation of the buffer layer is important for providing adequate relaxation of the relaxed layer on top of the graded buffer layer and thereby enabling a high strain in the second, strained layer on top of the relaxed layer. Thus, a silicon concentration of about 20% to 60% can induce a strain in a layer on top of the first layer, a concentration of about 20% to 50% can result in higher strains, and a concentration of about 20% to 40% is even more favorable to obtain a high strain characteristic of a layer on top of the first layer.

In another advantageous embodiment, the second layer is grown to a thickness less than 50 nm, which is below a critical thickness for preventing thermodynamic instability of the second layer. Since a very high strain can effectively build up in such a thin layer, a second layer with less than 50 nm thickness enhances the carrier mobility to ensure very good conductivity.

Another favorable method for fabricating a strained crystalline layer on an insulator includes: providing a semiconductor donor substrate of germanium and/or a Group (III)–Group (V)-semiconductor, providing at least one first crystalline epitaxial layer, wherein the content of germanium and/or the Group (III)–Group (V)-semiconductor of a buffer layer decreases during the first step, providing at least one second crystalline epitaxial layer on the first layer, providing at least one insulator layer, wherein the second layer is provided between the first layer and the insulator layer, and detaching the structure between the first layer and the second layer.

Such a method provides an efficient sequence of steps to produce a semiconductor structure which has a top layer of a second material having material characteristics that are different from the substrate of a first material, because a strain in the second layer can easily build up. The first layer works as an intermediate layer between the substrate and the second layer and can therefore be used to adapt the material characteristics between the first and the second materials to obtain a high quality semiconductor structure with a low defect density.

Starting with germanium and/or a Group (III)–Group (V)-semiconductor material as the semiconductor donor substrate, the material content of the buffer layer can be decreased to a relatively high amount of germanium and/or Group (III)–Group (V)-semiconductor material. Such a method provides an easy and efficient process for producing an intermediate product for fabricating a strained crystalline epitaxial layer, and results in high strain of the second crystalline layer, such as a silicon layer, on top of the first layer. The decrease of the germanium and/or the Group (III)–Group (V)-semiconductor content of the buffer layer allows at least a part of the first layer to have good crystalline characteristics and a low defect density, and a high quality second crystalline layer can be provided on top of the first layer in a short processing time. Therefore, good electronic characteristics of a strained second layer can be combined with the benefits of a SOI layer because the second strained layer can be provided on the insulator layer. The present method provides a simple sequence of steps for the easy fabrication of such novel semiconductor structure.

In addition, a semiconductor structure for fabricating a strained crystalline layer on an insulator includes a semiconductor donor substrate of a first material comprising germanium and/or a Group (III)–Group (V)-semiconductor; at least one crystalline epitaxial layer; and at least one insulator layer, wherein the crystalline epitaxial layer is an intermediate layer between the donor substrate and the insulator layer. Further, at least one crystalline epitaxial layer comprises a buffer layer including germanium and/or a Group (III)–Group (V)-semiconductor, the content of which decreases from the substrate to the insulator layer. Such a structure is a novel intermediate product for fabricating the strained crystalline layer on the insulator layer. Due to the decrease of germanium and/or the Group (III)–Group (V)-semiconductor material, the crystalline epitaxial layer can be grown with a low defect density but with a high germanium and/or Group (III)–Group (V)-semiconductor content. This provides a good basis for growth of a high strained and high quality further crystalline layer, for instance on the crystalline epitaxial layer.

In a favorable variant, the donor substrate is a single crystal germanium wafer, a single crystal Group (III)–Group (V)-semiconductor wafer, an epitaxial germanium layer, or an epitaxial Group (III)–Group (V)-semiconductor layer. The wafers as well as the epitaxial layer contain a high amount of germanium and/or the Group (III)–Group (V)-semiconductor which permits good growth of a high content germanium and/or Group (III)–Group (V)-semiconductor crystalline epitaxial layer, wherein the crystalline epitaxial layer has a low defect density.

In a favorable example of the invention, the germanium and/or Group (III)–Group (V)-semiconductor content of the crystalline epitaxial layer decreases to about 40% to 80%, preferably about 50% to 80% or about 60% to 80%. The percentage of about 40% to 80% germanium and/or GROUP (III)–GROUP (V)-semiconductor is relatively high and permits growth of a strained crystalline layer on top of the crystalline epitaxial layer, such as a silicon layer on top of the first layer. A concentration of about 50% to 80% is more advantageous because higher strains are possible, and the range of about 60% to 80% germanium will produce a very high strain in a crystalline layer on top of the crystalline epitaxial layer.

According to an advantageous example, the silicon content of the crystalline epitaxial layer increases from the substrate to the insulator layer. As explained above, the proportionate increase of silicon results in good lattice formation, which provides the basis for forming high quality crystalline characteristics and leads to a low defect density of the crystalline epitaxial layer.

In another advantageous embodiment, the silicon content increases to a proportion of about 20% to 60% silicon, preferably about 20% to 50% or about 20% to 40%. The percentage of about 20% to 60% silicon makes it possible to obtain a low defect density in the crystalline epitaxial layer and high crystallinity of the crystalline epitaxial layer, resulting in good formation of a top crystalline epitaxial layer such as a silicon layer. The percentage of 20% to 50% silicon is more favorable, and the percentage of 20% to 40% silicon is the most favorable for producing a high quality crystalline epitaxial layer which forms a very good basis for forming a strained crystalline layer of high quality on top of the crystalline epitaxial layer.

In yet another favorable implementation, the first layer and/or the second layer comprises carbon. The carbon concentration is preferably low, such as a few percent, and may be below 1% carbon. The addition of carbon results in excellent dopant stability and a high strain level in the first layer and/or the second layer.

A novel semiconductor structure of the present invention includes a semiconductor base substrate, at least one insulator layer; and at least one first crystalline epitaxial layer, wherein the insulator layer is an intermediate layer between the base substrate and the first layer. The first layer comprises a buffer layer which is a composition comprising germanium and/or a Group (III)–Group (V)-semiconductor, the content of which decreases from the insulator layer to the second layer. Due to the decrease of germanium and/or the Group (III)–Group (V)-semiconductor in the buffer layer, at least a part of the first layer has a very low defect density which can result in high quality crystalline characteristics in a further layer on top of the first layer.

In another preferable embodiment, the structure further comprises at least one strained second crystalline epitaxial layer, wherein the first layer is an intermediate layer between the insulator layer and the second layer. Such a structure combines both the benefits of a SOI-structure and the good conductivity characteristics of a strained crystalline layer. The strained layer can have a very high strain because the concentration of the germanium and/or the Group (III)–Group (V)-semiconductor content of the first layer can be adjusted.

In addition, a semiconductor structure for fabricating a strained crystalline layer on an insulator is provided. The structure includes a semiconductor donor substrate of a first material of germanium and/or a Group (III)–Group (V)-semiconductor, at least one first crystalline epitaxial layer, at least one second crystalline epitaxial layer, and at least one insulator layer. The first layer is an intermediate layer between the donor substrate and the second layer, the second layer is an intermediate layer between the first layer and the insulator layer, and the first layer comprises a buffer layer. The buffer layer includes germanium and/or the Group (III)–Group (V)-semiconductor, the content of which decreases in a direction away from the substrate to the second layer.

This intermediate structure permits fabrication of a strained crystalline layer on the insulator layer. By controlling the decrease of the germanium and/or the Group (III)–Group (V)-semiconductor content in the buffer layer, a relatively high amount of germanium and/or the Group (III)–Group (V)-semiconductor material results which causes a high strain of the second layer. The proportionate decrease of the germanium and/or the Group (III)–Group (V)-semiconductor further results in a low defect density of at least a part of the first layer leading to a high quality second layer. Further, the second strained layer can be advantageously deposited on the insulator layer so that an SOI-structure can be easily formed.

What is claimed is:
1. A semiconductor structure comprising:
   a semiconductor substrate of a first material comprising germanium or a Group(III)–Group(V)-semiconductor or alloy thereof;
   a crystalline epitaxial graded buffer layer upon the first material; and
   a crystalline epitaxial substantially relaxed layer on the buffer layer wherein the buffer layer is sufficiently relaxed to provide relaxation of the substantially relaxed layer deposited thereon, wherein the graded buffer layer has a concentration of germanium that decreases between the substrate and the relaxed layer.

2. The structure of claim 1 wherein the first material is germanium and the concentration of germanium in the graded layer decreases from 100 percent germanium to about 40 to 80 percent germanium.

3. The structure of claim 2 wherein the relaxed layer has a substantially constant silicon concentration of about 20 to 60 percent.

4. The structure of claim 1 wherein the semiconductor substrate comprises at least one of a single crystal germanium wafer, a single Group (III)–Group (V)-semiconductor wafer, a substrate having an epitaxial germanium layer, or a substrate having an epitaxial Group (III)–Group (V)-semiconductor layer.

5. The structure of claim 1 further comprising at least one crystalline epitaxial strained layer on the relaxed layer that is composed of a second material which is different from the first material.

6. The structure of claim 5 wherein the strained layer is a silicon layer.

7. The structure of claim 5 wherein the strained layer is less than 50 nanometers thick.

8. The semiconductor structure of claim 1 further comprising:
an insulator layer; and
a base substrate, so that the structure is a crystalline epitaxial substantially relaxed layer on an insulator.

9. The structure of claim 8 further comprising a strained crystalline epitaxial layer on the insulator layer or on the substantially relaxed layer.

10. A semiconductor structure comprising:
a semiconductor substrate of a first material comprising germanium or a Group(III)–Group(V)-semiconductor or alloy thereof;
a crystalline epitaxial graded buffer layer upon the first material;
a crystalline epitaxial substantially relaxed layer on the buffer layer wherein the buffer layer is sufficiently relaxed to provide relaxation of the substantially relaxed layer deposited thereon;
a weakened zone in the substantially relaxed layer;
an insulator layer; and
a base substrate, so that the structure is a crystalline epitaxial substantially relaxed layer on an insulator.

11. A semiconductor structure comprising:
a semiconductor substrate of a first material comprising germanium or a Group(III)–Group(V)-semiconductor or alloy thereof;
a crystalline epitaxial graded buffer layer upon the first material;
a crystalline epitaxial substantially relaxed layer on the buffer layer wherein the buffer layer is sufficiently relaxed to provide relaxation of the substantially relaxed layer deposited thereon;
an insulator layer;
a base substrate, so that the structure is a crystalline epitaxial substantially relaxed layer on an insulator; and
a strained crystalline epitaxial layer on the insulator layer or on the substantially relaxed layer;
wherein at least one of the buffer layer and the relaxed layer comprises carbon.

12. The structure of claim 10 wherein the first material is germanium and the germanium concentration through the buffer layer decreases from 100 percent to about 40 to 80 percent.

13. The structure of claim 12 wherein the relaxed layer has a substantially constant silicon content of about 20 percent to about 60 percent.

14. The structure of claim 12 further comprising at least one additional crystalline epitaxial strained layer of a second material which is different from the first material, with the additional layer being present on the relaxed layer.

15. The structure of claim 14 wherein the strained layer is a silicon layer.

16. The structure of claim 1 which further comprises a weakened zone in the buffer layer to facilitate transfer of at least the relaxed layer.

17. The structure of claim 1 wherein the buffer layer includes a graded layer and a substantially relaxed layer.

18. The structure of claim 17 wherein the weakened zone is provided in the substantially relaxed layer.

19. The structure of claim 18 wherein the further layer is an insulator layer, so that the insulator layer and part of the relaxed layer can be transferred.

20. The structure of claim 19 wherein the insulator layer is bonded to a base wafer, and is detached along the weakened zone in the relaxed layer to form a semiconductor structure that includes a portion of the relaxed layer, the insulator layer, and the base wafer.

21. The structure of claim 20 which further comprises a strained crystalline epitaxial layer on the portion of the relaxed layer of the transfer structure.

22. The structure of claim 18 wherein the further layer is an epitaxially grown strained layer.

23. The structure of claim 22 which further comprises an insulator layer on the strained layer.

24. The structure of claim 23 wherein the weakened zone is provided in the boundary plane between the relaxed layer and the strained layer and the insulator layer is bonded to a base wafer.

25. The structure of claim 24 semiconductor structure that includes the strained layer, the insulator layer, and the base wafer is formed after detachment along the weakened zone in the boundary plane.

26. The structure of claim 25 wherein any residual portion of the relaxed layer is removed from the strained layer.

27. The structure of claim 26 wherein the strained layer is less than 50 nanometers thick.

28. The structure of claim 21 further comprising a heat treated the structure.

29. The structure of claim 10 wherein the weakened zone is provided by atomic species after depositing the further layer.

30. The structure of claim 11 wherein the carbon composition is at a level below one percent.

31. The structure of claim 1 wherein the semiconductor substrate comprises at least one of a single crystal germanium wafer, a Group(III)–Group(V)-semiconductor wafer, a substrate having an epitaxial germanium layer, or a substrate having an epitaxial Group(III)–Group(V)-semiconductor layer.

* * * * *